(12) United States Patent
Sato

(10) Patent No.: US 12,263,634 B2
(45) Date of Patent: Apr. 1, 2025

(54) SUBSTRATE PROCESSING METHOD, SUBSTRATE HOLDING APPARATUS, MOLDING APPARATUS, AND ARTICLE MANUFACTURING METHOD

(71) Applicant: CANON KABUSHIKI KAISHA, Tokyo (JP)

(72) Inventor: Hiroshi Sato, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 693 days.

(21) Appl. No.: 17/409,241

(22) Filed: Aug. 23, 2021

(65) Prior Publication Data

US 2022/0063175 A1 Mar. 3, 2022

(30) Foreign Application Priority Data

Aug. 27, 2020 (JP) .................. 2020-143389

(51) Int. Cl.
*B29C 59/00* (2006.01)
*B29C 59/02* (2006.01)
*G03F 7/00* (2006.01)
*H01L 21/56* (2006.01)

(52) U.S. Cl.
CPC .......... *B29C 59/002* (2013.01); *B29C 59/022* (2013.01); *B29C 59/026* (2013.01); *G03F 7/0002* (2013.01); *H01L 21/565* (2013.01)

(58) Field of Classification Search
CPC ............... B29C 59/002; B29C 59/022; B29C 59/026; G03F 7/0002; G03F 7/70733; G03F 7/20; G03F 7/70633; G03F 7/7065; G03F 7/70716; G03F 7/7085; G03F 7/70875; G03F 7/70983; H01L 21/565
See application file for complete search history.

(56) References Cited

U.S. PATENT DOCUMENTS

| 5,837,555 A | 11/1998 | Kaltenbrunner | |
| 2017/0023857 A1* | 1/2017 | Sato | G03F 9/7042 |
| 2018/0182611 A1* | 6/2018 | Sekimoto | H01L 21/027 |

FOREIGN PATENT DOCUMENTS

| JP | 2001274064 A | 10/2001 |
| JP | 2003142552 A | 5/2003 |
| JP | 2019220652 A | 12/2019 |
| KR | 20190079027 A | 7/2019 |

* cited by examiner

*Primary Examiner* — Dale E Page
*Assistant Examiner* — Quovaunda Jefferson
(74) *Attorney, Agent, or Firm* — Canon U.S.A., Inc. I.P. Division

(57) ABSTRACT

A substrate processing method includes a first process configured to process a substrate with a top plate disposed nearer an upper surface of the substrate, the substrate being held by a substrate holding unit of a first substrate holding apparatus, a second process configured to raise the substrate with the top plate disposed on the first substrate holding apparatus to make a space between the substrate holding unit and the substrate, a third process configured to insert a substrate conveyance apparatus for conveying the substrate with the top plate disposed on the first substrate holding apparatus to a second substrate holding apparatus into the space, and a fourth process configured to convey the substrate to the second substrate holding apparatus.

16 Claims, 8 Drawing Sheets

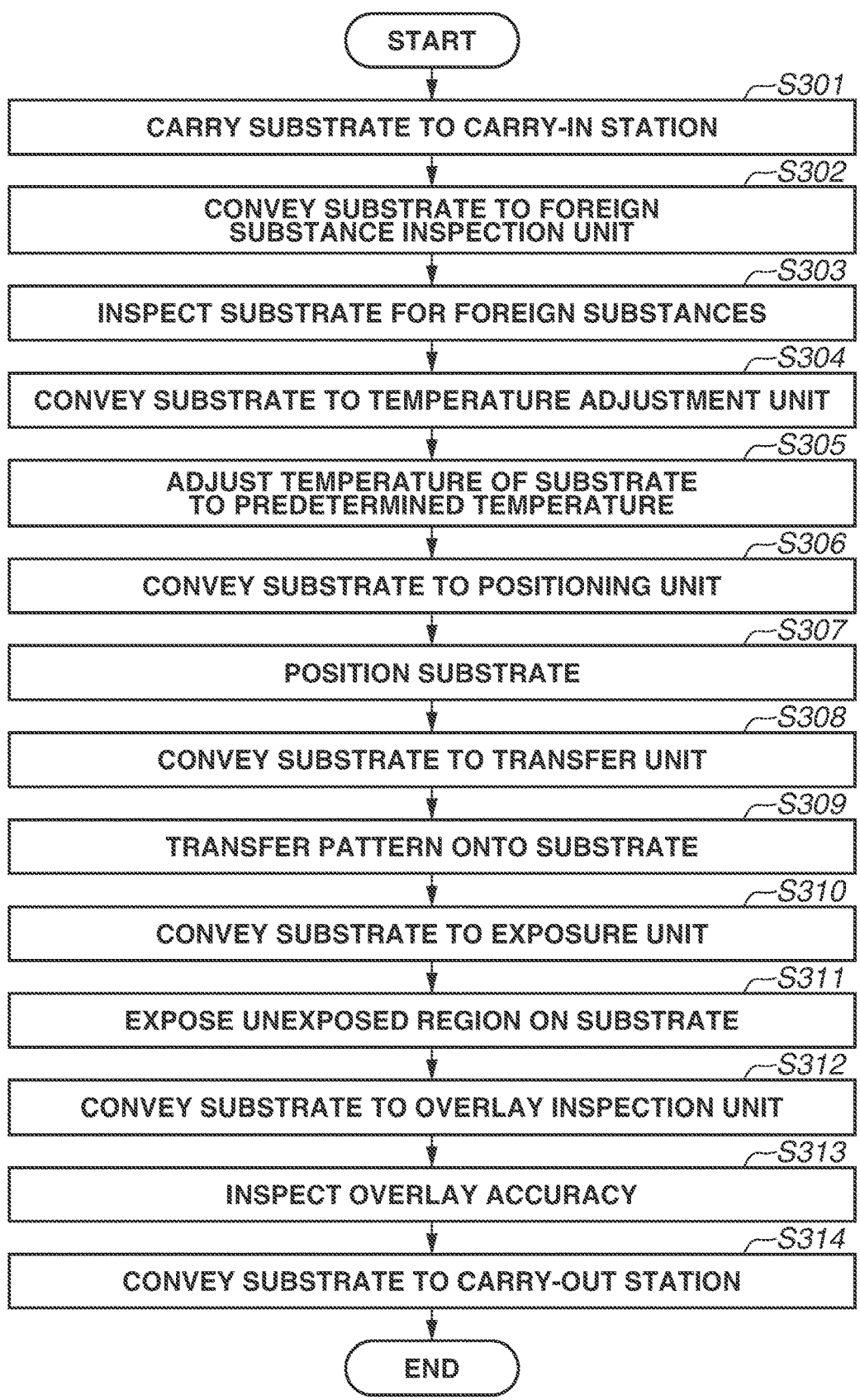

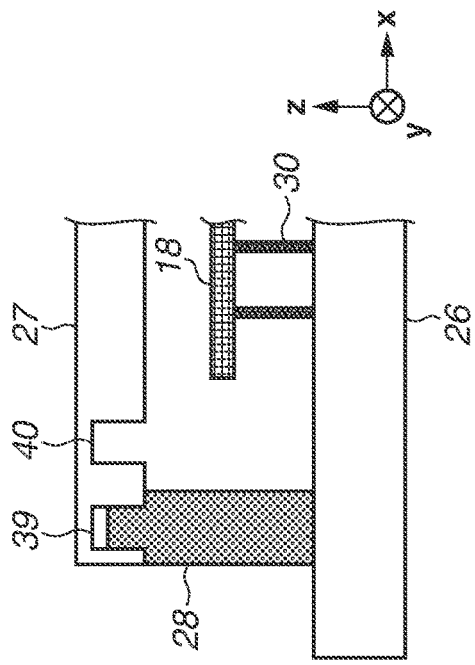
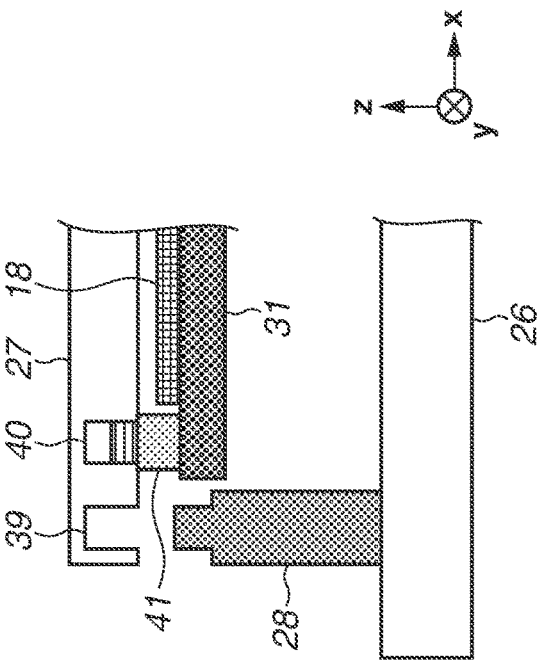
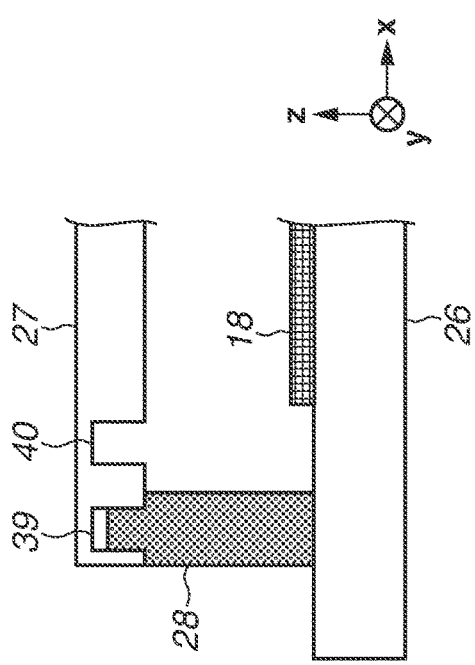
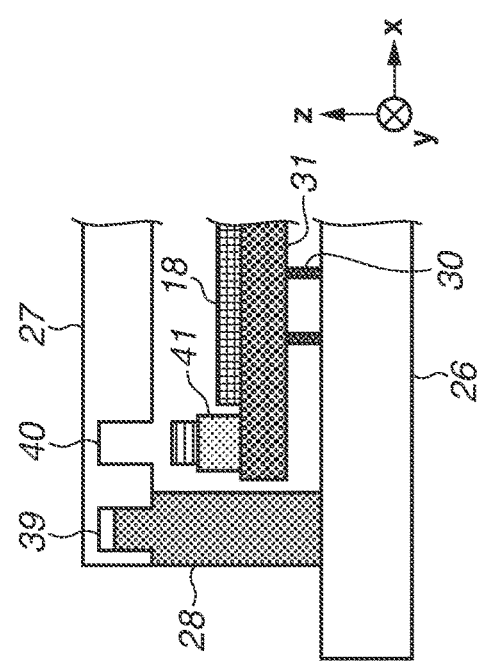

SUBSTRATE PROCESSING METHOD, SUBSTRATE HOLDING APPARATUS, MOLDING APPARATUS, AND ARTICLE MANUFACTURING METHOD

BACKGROUND

Field of the Disclosure

The present disclosure relates to a substrate processing method, a substrate holding apparatus, a molding apparatus, and an article manufacturing method.

Description of the Related Art

With the increase in demand for miniaturization of semiconductor devices and Micro Electro Mechanical Systems (MEMS), an imprint technique of molding an imprint material on a substrate with molds has attracted attention. An imprint apparatus employing the imprint technique makes it possible to form a fine structure having the order of several nanometers on a substrate. The imprint apparatus is used to manufacture molds of replicas based on a master mold, as well as to manufacture semiconductor devices.

If the imprint apparatus performs imprint processing with foreign substances on the substrate, a defective pattern will be formed on the substrate or the substrate and mold will be damaged. Thus, it is important that the imprint apparatus prevents the occurrence of foreign substances and at the same time prevents foreign substances from falling on the substrate. This is not limited to the imprint apparatus, i.e., it is also unfavorable that foreign substances are on the substrate or reticle in all types of lithography apparatuses, e.g., an exposure apparatus.

In the manufacturing process of semiconductor devices, more strict management for dust and chemical contaminations has been demanded along with the pattern miniaturization due to the increased integration of integrated circuits. Japanese Patent Application Laid-Open No. 2003-142552 discusses a method of reducing foreign substances on a substrate by covering the substrate with a box.

However, the technique discussed in Japanese Patent Application Laid-Open No. 2003-142552 cannot reduce foreign substances on the substrate while the substrate is out of the box. For various measurements on the substrate in an apparatus, the substrate is taken out of the box. There may arise an issue with foreign substances on the substrate taken out of the box. In addition, the box can excessively occupy the limited space in the apparatus.

SUMMARY

According to an aspect of the present invention, a substrate processing method of reducing foreign substances on a substrate is provided. The substrate processing method includes a first process configured to process a substrate with a top plate disposed nearer an upper surface of the substrate, the substrate being held by a substrate holding unit of a first substrate holding apparatus, a second process configured to raise the substrate with the top plate disposed on the first substrate holding apparatus to make a space between the substrate holding unit and the substrate, a third process configured to insert a substrate conveyance apparatus for conveying the substrate with the top plate disposed on the first substrate holding apparatus to a second substrate holding apparatus into the space, and a fourth process configured to convey the substrate to the second substrate holding apparatus.

Further features of the present invention will become apparent from the following description of exemplary embodiments with reference to the attached drawings.

BRIEF DESCRIPTION OF THE DRAWINGS

FIG. 3 is a flowchart illustrating a procedure of the substrate processing performed by the imprint apparatus.

FIGS. 7A to 7D illustrate a substrate transfer operation according to a second exemplary embodiment.

DESCRIPTION OF THE EMBODIMENTS

Some exemplary embodiments of the present disclosure will be described in detail below with reference to the accompanying drawings.

In a first exemplary embodiment, an imprint apparatus will be described that is largely affected by foreign substances and registration volatilization. However, the present invention is not limited thereto. The present invention is also applicable to an exposure apparatus or a drawing apparatus using electron beams to expose a photosensitive agent coated on a substrate to form patterns thereon. In the following drawings, like numbers refer to like elements, and redundant descriptions thereof will be omitted.

(Configuration of Imprint Apparatus)

An overview of the imprint apparatus according to the present exemplary embodiment will be described. The imprint apparatus brings an imprint material (composition) supplied on a substrate into contact with a mold and then applies curing energy to the imprint material to form a cured material pattern in the structural pattern transferred from the mold.

The imprint material used is a curable composition to be cured by curing energy applied thereto (the curable composition is sometimes referred to as an uncured resin). Examples of the usable curing energy include electromagnetic waves and heat. Examples of electromagnetic waves include light with a wavelength in the range from 10 nm to 1 mm, such as infrared light, visible light, and ultraviolet light. The curable composition may be a composition to be cured by light irradiation or heating. Of these, a photo-curable composition cured by light irradiation may contain at least a polymerizable compound and a photo-polymerizable initiator and, as appropriate, may further contain a non-polymerizable compound or a solvent. A non-polymerizable compound is at least one compound selected from the groups, sensitizers, hydrogen donors, internal mold release agents, interfacial active agents, antioxidants, and polymer components.

The imprint material is supplied to the substrate by an imprint material supply unit, in droplets, or in islands or film composed of a plurality of concatenated droplets. In one or more embodiments, the viscosity of the imprint material (at 25° C.) ranges between 1 mPa·s and 100 mPa·s. Examples of the materials usable for the substrate include glass, ceramics, metal, semiconductor, and resin. In one or more embodiments, the surface of the substrate is provided with a member different in material from the substrate. For example, the substrate is a silicon wafer, a compound semiconductor wafer, or silica glass.

Figure 1:
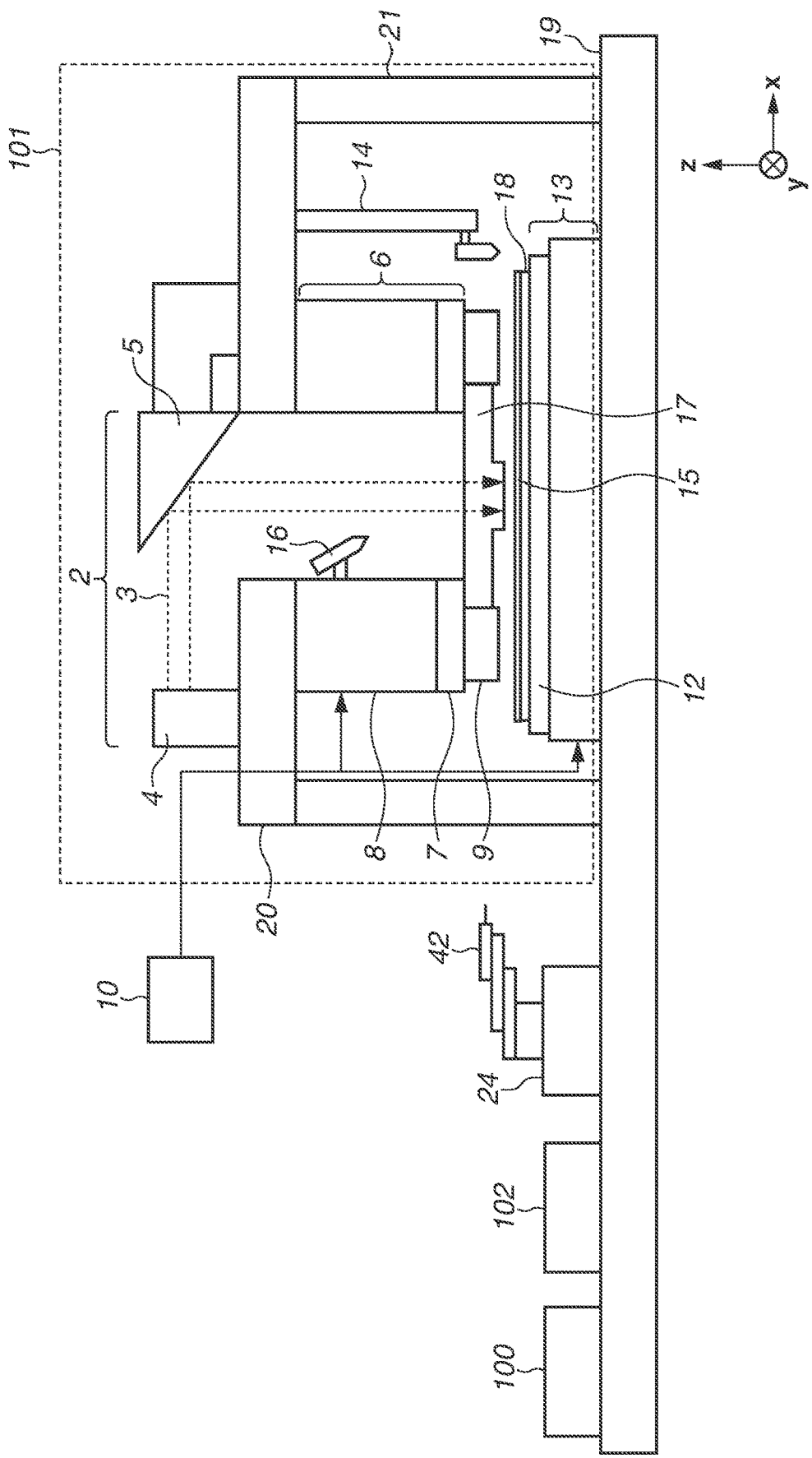
FIG. 1 illustrates a configuration of an imprint apparatus.

FIG. 1 schematically illustrates a configuration of an imprint apparatus 1 according to the present exemplary embodiment. The imprint apparatus 1 has a transfer unit 101 to perform imprint processing of bringing an imprint material 15 on a substrate 18 into contact with a mold 17 to form a pattern of the imprint material. The imprint processing by the imprint apparatus 1 includes supplying the imprint material 15 to the surface of the substrate 18 and curing the imprint material 15 in contact with the mold 17 (hereinafter referred to as imprint processing).

According to the present exemplary embodiment, the imprint apparatus 1 employs a photo-curing method of irradiating an imprint material with ultraviolet (UV) to cure the imprint material as a method of curing the imprint material 15. The imprint apparatus 1 irradiates the imprint material 15 on the substrate 18 in contact with the mold 17 with ultraviolet light to cure the imprint material 15, forming a pattern on the imprint material 15. In one or more embodiments, the imprint apparatus 1 cures the imprint material 15 through the irradiation of light in another wavelength region or uses a curing method of curing the imprint material 15 by heat energy.

A highly volatile material has conventionally been used as the imprint material 15. That has typically led to a method of repeating the application of the imprint material to the following imprint shot each time imprint processing is performed. As a low volatility imprint material 15 has been developed recently, there are more and more cases of using a technique of pre-applying the imprint material 15 to the entire surface of the substrate 18 through spin coating. This method enables the omission of the process of applying the imprint material 15 to the following imprint shot each time imprint processing is performed, which is expected to increase productivity. The following is a description of mainly a configuration with the latter imprint material 15 over the entire surface of the substrate 18 according to the present exemplary embodiment. Both the techniques are effective in preventing foreign substances on substrates (described below).

In the present exemplary embodiment, a method will be described of supplying the imprint material 15 to the entire surface of the substrate 18 and then repeating the imprint processing without inserting a process of supplying the imprint material 15. The present invention however is not limited thereto. In one or more embodiments, a method is used of alternately repeating the supply of the imprint material 15 to the surface of the substrate partially, not entirely, and the imprint processing. According to the present exemplary embodiment, both the techniques are expected to have the effects of reducing foreign substances on the substrate 18 and of reducing the volatilization of the imprint material 15. In FIG. 1, the directions perpendicularly intersecting with each other in the plane along the surface of the substrate 18 supplied with the imprint material 15 are referred to as the x and y axes. The direction perpendicularly intersecting with the x and y axes (the direction parallel to the optical axis of ultraviolet light emitted on the imprint material 15) is referred to as the z axis.

The imprint apparatus 1 includes a curing unit 2, an imprint head 6 to hold the mold 17, a substrate stage 13 to hold the substrate 18, a supply unit 14, an alignment measurement unit 16, and a control unit 10. The curing unit 2 irradiates the mold 17 with ultraviolet light in the imprint processing. The curing unit 2 includes a light source 4, and a plurality of optical systems 5 to adjust ultraviolet light 3 emitted from the light source 4 to light suitable for the imprint processing.

The mold 17, for example, has a perimeter in a rectangular and a three dimensional pattern region to form the structural pattern on the imprint material 15 supplied to the substrate 18, the pattern region of which is opposed to the substrate 18. The material for the mold 17 is an ultraviolet-transmitting material, such as quartz.

The imprint head 6 includes, for example, a mold chuck 7, a mold stage 8, and a mold shape correction mechanism 9. The mold chuck 7 holds the mold 17 by mechanical holding means such as vacuum suction force or electrostatic attraction force. The mold chuck 7 is held to the mold stage 8 by mechanical holding means. The mold stage 8 includes a drive system for determining the gap between the mold 17 and the substrate 18 when bringing the mold 17 into contact with the substrate 18, and moves the mold 17 along the z-axis. In one or more embodiments, the drive system of the mold stage 8 has the functionality of moving the mold 17 along the x-axis, y-axis, and θ (rotational directions around the x, y, and z axes) as well as the z-axis direction. The mold shape correction mechanism 9, a mechanism for correcting the shape of the mold 17, is disposed at a plurality of positions to surround the perimeter of the mold 17.

The substrate stage 13 holds the substrate 18 and, when the mold 17 is brought into contact with the substrate 18, corrects the translation shift between the mold 17 and the substrate 18 in the x and y plane. The substrate stage 13 includes a substrate chuck 12 for attracting and holding the substrate 18. Applicable methods of attracting the substrate 18 are vacuum suction, electrostatic attraction, and other attraction methods. The substrate stage 13 includes a drive system to drive the substrate 18 along the x- and y-axes to correct the translation shift between the mold 17 and the substrate 18 in the x and y plane. In one or more embodiments, the drive system in the x- and y-axes includes a plurality of drive systems such as a coarse moving drive system and a fine moving drive system. In one or more embodiments, the substrate stage 13 further includes a drive system to adjust the position along the z-axis, a function for adjusting the position of the substrate 18 in the θ direction (a rotational direction around the z axis), and a tilt function for correcting the inclination of the substrate 18.

The substrate 18 is a member made of glass, ceramics, metal, semiconductor, and resin. As appropriate, the surface of the member is provided with a layer different in material from the member. Examples of the substrate 18 includes a silicon wafer, a compound semiconductor wafer, and a fused quartz plate. The transfer unit 101 forms a pattern on the substrate 18 by repeating the imprint processing on each shot region. Instead of the substrate 18 for forming a pattern, a maintenance substrate for detecting foreign substances may be used. The imprint apparatus 1 further includes a base surface plate 19 for holding the substrate stage 13, a bridge surface plate 20 for holding the imprint head 6, and a support 21 for supporting the bridge surface plate 20.

To supply imprint material 15 each time imprint processing is performed instead of pre-applying the imprint material 15 to the entire surface, the imprint apparatus 1 includes a supply unit 14 (dispenser). For example, the supply unit 14 has a discharge nozzle (not illustrated) to supply the imprint material 15 from the discharge nozzle onto the substrate 18. According to the present exemplary embodiment, the imprint material 15 is a resin with a property of being cured by ultraviolet light. The amount of the imprint material 15 to be supplied may be determined by the thickness of the imprint material 15 and the density of the pattern to be formed.

The alignment measurement unit 16 detects alignment marks on the mold 17 and the substrate 18 to measure positional deviations between the pattern formed on the substrate 18 and the pattern region of the mold 17 in the x- and y-axis directions, and the shape difference.

A unit 100 performs substrate processing before the substrate 18 is conveyed to the transfer unit 101. The unit 102 performs substrate processing after a pattern is formed on the substrate 18 by the transfer unit 101. A substrate conveyance apparatus 42 on the conveyance unit 24 conveys the substrate 18 in the imprint apparatus 1. In one or more embodiments, a unit similar to the substrate stage 13 holds the substrate 18 and is driven to convey the substrate 18.

The control unit 10 controls operations and adjustments of all of the units included in the imprint apparatus 1. For example, the control unit 10 including a computer is connected to each unit included in the imprint apparatus 1 via a communications line, and controls each unit based on programs.

Figure 2:
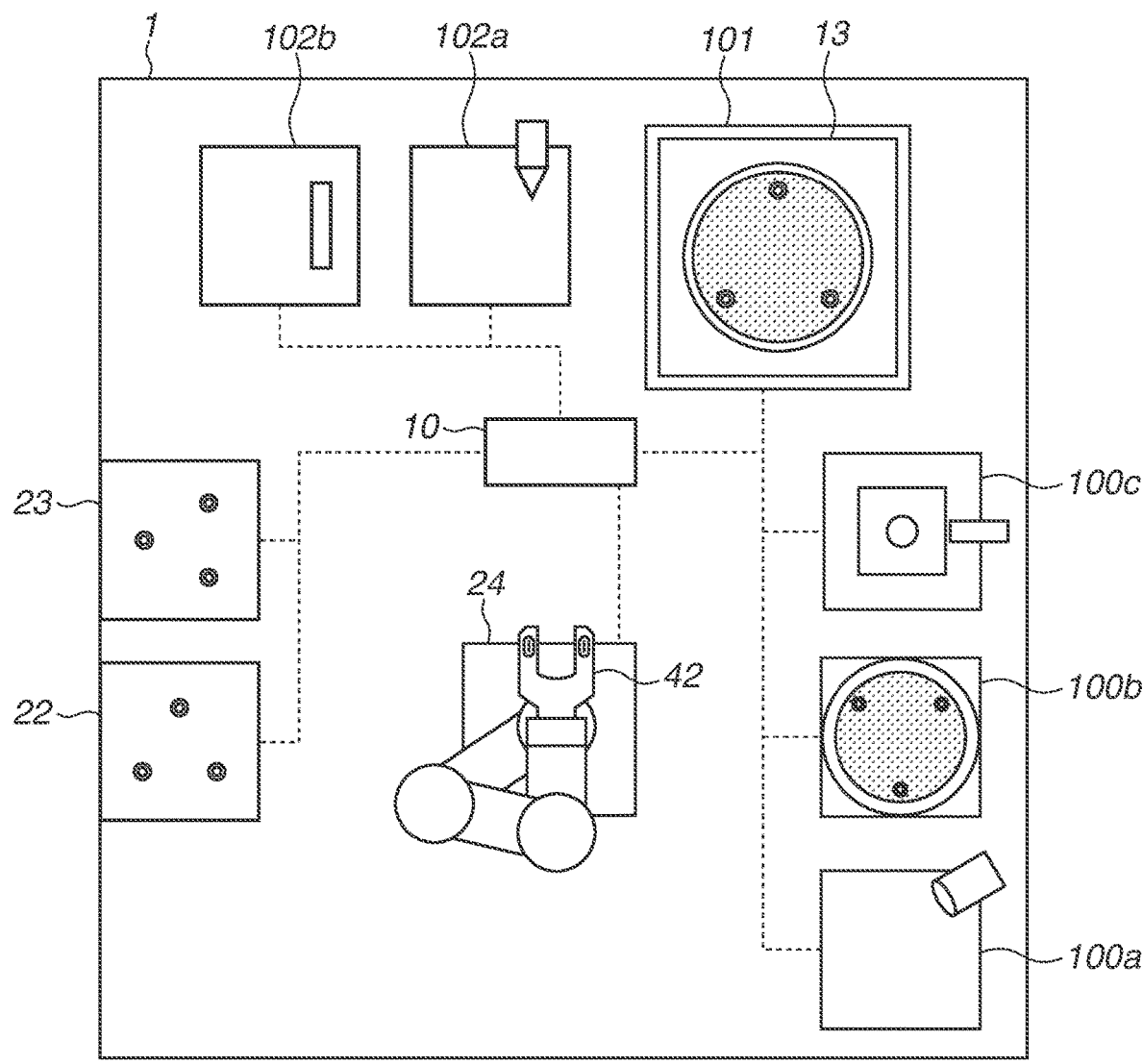
FIG. 2 illustrates each unit that performs substrate processing in the imprint apparatus.

FIG. 2 illustrates units that perform substrate processing in the imprint apparatus 1 according to the present exemplary embodiment. The units include a foreign substance inspection unit 100*a*, a temperature adjustment unit 100*b*, a position detection unit 100*c*, a transfer unit 101, an exposure unit 102*a*, and an overlay inspection unit 102*b*. The imprint apparatus 1 also includes an in-line station for receiving and sending the substrate 18 inside and outside the imprint apparatus 1. The in-line station includes a carry-in station 22 and a carry-out station 23. For example, when the imprint apparatus 1 is connected to such an apparatus as a coater developer and an Equipment Front End Module (EFEM), the substrate 18 is conveyed to the carry-in station 22 and then undergoes substrate processing by each unit. The substrate 18 that has undergone the substrate processing is conveyed to the carry-out station 23. The carry-in station 22 and the carry-out station 23 are two apparatuses of the substrate holding apparatuses in the imprint apparatus 1.

The carry-in station 22 and the carry-out station 23 may be configured as a single unit that is operated at adjusted carry-in and carry-out timings.

The above-described configuration in the apparatus varies with the specifications and standards of the transfer process. The above-described configuration in the apparatus may not be used if a measuring apparatus outside a transfer apparatus performs similar measurements.

The following is a description of the units through which the substrate 18 passes after the substrate 18 is conveyed to the carry-in station 22 until it is conveyed to the carry-out station 23, and the substrate processing performed by each unit with reference to FIG. 3. FIG. 3 is a flowchart illustrating a procedure of the substrate processing performed inside the imprint apparatus 1. The substrate processing performed inside the imprint apparatus 1 is performed through control of each unit of the imprint apparatus 1 by the control unit 10.

In step S301, the substrate 18 is carried from the outside of the imprint apparatus 1 to the carry-in station 22 by a conveyance unit (not illustrated). The conveyance operation of the substrate 18 in the imprint apparatus 1 (described below) is performed by the conveyance unit 24 in the imprint apparatus 1. The conveyance unit 24 is one of the substrate holding apparatuses in the imprint apparatus 1.

In step S302, the conveyance unit 24 conveys the substrate 18 to the foreign substance inspection unit 100*a*. In step S303, the foreign substance inspection unit 100*a* inspects the substrate 18 for foreign substances. For example, in a foreign substance inspection method, light is emitted obliquely on the evaluation surface of the substrate 18. The light is regularly reflected on the flat evaluation surface of the substrate 18, or the light is scattered from the evaluation surface with irregularities. The foreign substance inspection unit 100*a* detects that scattering light to determine that the evaluation surface has irregularities, that is, foreign substances are present on the evaluation surface. Alternatively, there is a foreign substance inspection method of detecting foreign substances based on the difference from the preceding and following shots through image observation. That method uses a high-resolution scope to inspect micro foreign substances. The foreign substance inspection unit 100*a* is one of the substrate holding apparatuses in the imprint apparatus 1.

In step S304, the conveyance unit 24 conveys the substrate 18 to the temperature adjustment unit 100*b*. In step S305, the temperature adjustment unit 100*b* adjusts the temperature of the substrate 18 to a predetermined temperature. Temperature change in the substrate 18 causes the expansion and contraction of the substrate 18 based on the thermal expansion coefficient of the substrate material, resulting in a temperature magnification error. Thus, achieving high pattern accuracy involves precise thermal management, for which the substrate 18 is adjusted to a predetermined temperature. The temperature adjustment is typically performed by holding the substrate 18 with the substrate holding apparatus provided with a temperature adjustment plate (a plate with a heater and a liquid-cooled unit). The temperature adjustment unit 100*b* is one of the substrate holding apparatuses in the imprint apparatus 1.

In step S306, the conveyance unit 24 conveys the substrate 18 to the position detection unit 100*c*. In step S307, the position detection unit 100*c* adjusts the center position and rotational direction of the substrate 18 to a constant carry-in position in the conveyance of the substrate 18 to the substrate stage 13. For example, if the substrate 18 is a silicon substrate, the position and orientation of the substrate 18 can be determined through the detection of the orientation flat indicating the crystal orientation, the notch positions, and the outer shape of the substrate 18. A pattern on the substrate 18 may be used to determine them by detecting it.

More detailed measurements are made with increased positioning accuracy. Various measurements can be performed on the substrate 18 that has been conveyed to the transfer unit 101, which will cause a lower level of productivity of the substrate processing. The decrease in productivity can be prevented by the position detection unit 100*c* specialized in measurement separate from the transfer unit 101. In the present exemplary embodiment, the position detection unit 100*c* is provided with the functionality of making various measurements; otherwise, a measurement unit may be used separately. For example, the measurement unit may make optical measurement on various types of mark or pattern on the substrate 18 and pre-calculate the shot array and shot shape with the amount of the stage being driven in addition to the measurements. Transferring the calculation results to a transfer mechanism enables data for improving the positioning accuracy to be collected, without reducing the productivity. The measurement results of marks and patterns made in the previous process may not be usable due to the effect of foreign substances or include error due to distortion or unevenness. The transfer unit 101 can be used to pre-observe marks and patterns to be used to determine whether these marks and patterns are usable for measurement.

In step S308, the conveyance unit 24 conveys the substrate 18 to the substrate stage 13 in the transfer unit 101. In step S309, the transfer unit 101 irradiates the substrate 18 with a pattern formed thereon in contact with the mold 17 via the imprint material 15 with light, curing the imprint material 15, and transfer the structural pattern of the mold 17 to the substrate 18. In parallel with the transfer processing on the substrate 18, the transfer unit 101 also performs the relative position alignment between the substrate 18 and the mold 17. In the relative position alignment, the transfer unit 101 calculates the relative position by observing the mold 17 and the marks on the substrate 18 during the imprint processing to perform relative position alignment based on the calculation results (this method is what is called a die-by-die alignment scheme). Proposed methods of correcting the shot shape include a method of pressurizing the lateral side of the mold 17 to change the shape of the mold 17, and a method of irradiating the substrate 18 with light to cause uneven temperature distribution that corrects the shot shape to a desired one using the expansion difference of the substrate 18 due to the temperature distribution. The shot shape correction uses as source data the results of measurements in the transfer unit 101, measurements in step 306, and prior measurements outside the apparatus, and past transfer results. The substrate stage 13 that holds the substrate 18 in the transfer unit 101 is one of the substrate holding apparatuses in the imprint apparatus 1.

In step S310, the conveyance unit 24 conveys the substrate 18 to the exposure unit 102a. In step S311, the exposure unit 102a irradiates the area of the imprint material 15 that has not been processed in the transfer unit 101 on the substrate 18 with light, curing the area. Although a typical silicon substrate processed by the imprint apparatus 1 is in a circular shape, frequent shot shapes are in a rectangular. With that combination, imprint processing may not be performed in the vicinity of the outer circumference of a circular substrate because shots there cannot form rectangles. In addition, such a non-imprint area may occur between shots. However, volatilization of the imprint material 15 in the non-imprint area in the following process presents a structural difference between the non-imprint area and the area that has undergone the imprint processing. As the non-imprint area is no longer protected by the imprint material 15, for example, the area without the imprint material 15 and the adjacent area can be too much etched in the following etching process, adversely affecting the article to be manufactured. Thus, the exposure unit 102a irradiates the non-imprint area with ultraviolet light to cure the imprint material 15 like the area that has undergone the imprint processing. The exposure unit 102a is one of the substrate holding apparatuses in the imprint apparatus 1. Part of exposure light from the light source 4 used in the transfer unit or a small light source such as a light emitting diode (LED) or laser diode (LD) may be used for the above purpose. In recent years, for example, as recently developed LEDs comes with various wavelengths ranging from the ultraviolet to the infrared regions, a suitable LED may be selected to be used.

In step S312, the conveyance unit 24 conveys the substrate 18 to the overlay inspection unit 102b. In step S313, the overlay inspection unit 102b inspects the overlay accuracy of the pattern transferred in the transfer unit 101. The inspection by the overlay inspection unit 102b in the imprint apparatus 1 allows the inspection result to be immediately fed back as compared with the case where the inspection is performed outside the apparatus. The overlay inspection is performed by the method of measuring the relative positions between marks on the substrate 18 and marks newly formed through transfer in the transfer unit 101 at two or more positions, and determining distortions or positional deviations in the transferred pattern through computation. The overlay inspection unit 102b is one of the substrate holding apparatuses in the imprint apparatus 1. With a high-resolution scope, the overlay inspection unit 102b can observe the transfer pattern to check any defective points in the transfer process. In imprint transfer, for example, the overlay inspection unit 102b can also check whether a pattern has been formed and whether there are any portions unfilled with the imprint material 15, and observe the resist thickness based on the difference in the filling performance, image shading, and image hue between shots.

In step S314, the conveyance unit 24 conveys the substrate 18 to the carry-out station 23. Then, the substrate 18 is conveyed from the carry-out station 23 to the outside of the imprint apparatus 1 by a conveyance unit (not illustrated).

The following is a description of effects of foreign substances on the substrate 18 and of volatilization of the imprint material 15. The foreign substances on the substrate 18 after the imprint apparatus 1 receives the substrate 18 until the substrate 18 is conveyed to the transfer unit 101 will remain in between the substrate 18 and the mold 17 in the imprint processing. Foreign substances between the substrate 18 and the mold 17 cause a transfer pattern failure or cause damage to the pattern of the mold 17, making it impossible to use the mold 17 in the subsequent imprint processing. Foreign substances on the substrate 18 after the imprint processing can cause a processing failure in the subsequent processes. The processes should keep the substrate 18 away from foreign substances. The present exemplary embodiment is expected to have an effect of preventing foreign substances from falling on the substrate 18.

(Configuration of Substrate Holding Apparatus)

Figure 4A:
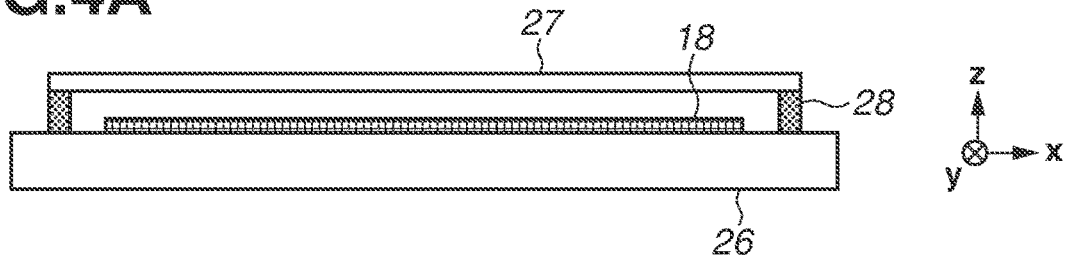
FIGS. 4A to 4D illustrate a configuration of a substrate holding apparatus.
Figure 4B:
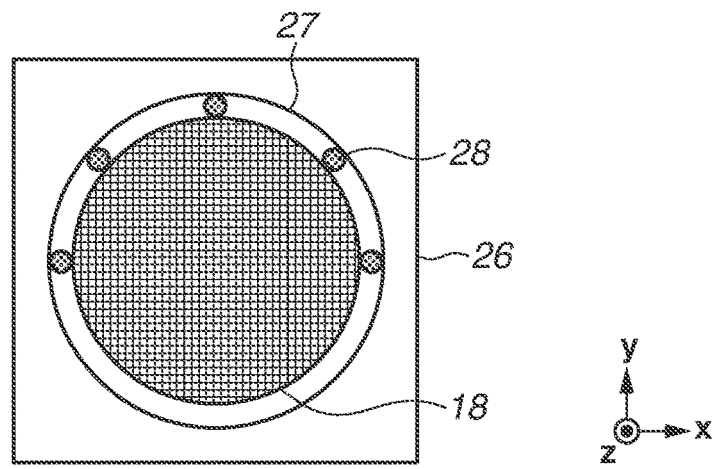
Figure 4C:
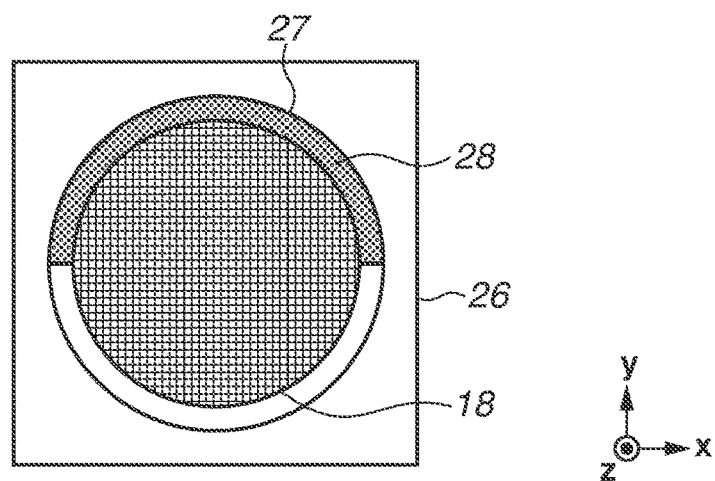
Figure 4D:
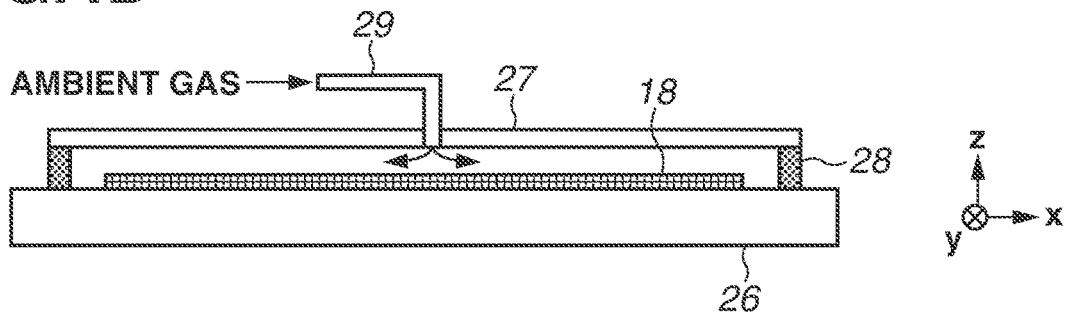

The substrate holding apparatus according to the present exemplary embodiment will be described. FIGS. 4A to 4D illustrate a configuration of the substrate holding apparatus. FIGS. 4A and 4D are side views illustrating the substrate holding apparatus, and FIGS. 4B and 4C are top views illustrating the substrate holding apparatus. The substrate holding apparatus includes a substrate holding unit 26, a top plate 27, and a member 28. The substrate 18 is on the substrate holding unit 26 with the bottom surface of the substrate 18 held by vacuum chucking or electrostatic chucking. The top plate 27 is located over the substrate 18 to protect the substrate 18. More specifically, the top plate 27 prevents foreign substances from falling on the substrate 18 and the volatilization of the imprint material 15 on the substrate 18. A substrate holding apparatus with high-precision drive may be equipped with a linear motor or an interferometer or encoder for position measurement.

The member 28 is disposed on the substrate holding unit to support the top plate 27. The member 28 does not cover the closed space between the substrate holding unit 26 and the top plate 27 as long as the member 28 can support the top plate 27. The top plate 27 is disposed close to the substrate 18, which prevents the inflow of foreign substances from the above and from the lateral side. As illustrated in FIG. 4B, a plurality of columnar members 28 may be disposed to provide space for receiving and sending the substrate 18 through the lateral side of the substrate 18. As illustrated in FIG. 4C, one member 28 may be disposed.

A fluid has viscosity on the boundary surface between the fluid and a solid, depending on the distance from the boundary surface. Viscosity has an effect on a very small region near the boundary surface and little influence on positions distant from the boundary surface. In the substrate holding apparatus according to the present exemplary embodiment, the substrate 18 and the top plate 27 are close to each other, which offers fluid viscosity in space between the substrate 18 and the top plate 27.

The formula of the Hagen-Poiseuille flow is known as a steady laminar flow solution of a fluid with viscosity flowing through a circular tube. The formula of the planar Poiseuille flow, transformed from this above-described formula, represents the flow rate of a fluid between two different stationary parallel flat plates. The formula of the planar Poiseuille flow represents a low flow rate at positions near the flat plates and a high flow rate at positions distant from the flat plates. In other words, the flow rate of a fluid decreases in a smaller space between the flat plates, making the fluid between the flat plates hard to move. According to the present exemplary embodiment, for example, a configuration with the gap between the upper surface of the substrate 18 and the bottom surface of the top plate 27 set to 2 mm or less will have an effect of reducing the inflow of gas from the lateral side, thus preventing foreign substances from falling on the substrate 18. Based on the formula of the planar Poiseuille flow, the above-described effect can be improved by decreasing the gap between the upper surface of the substrate 18 and the bottom surface of the top plate 27. The viscosity property however depends on the type of gas. That means that the gap between the upper surface of the substrate 18 and the bottom surface of the top plate 27 is optimized.

As illustrated in FIG. 4D, the intake of the ambient gas through a vent 29 in the top plate 27 produces a positive pressure in the space between the top plate 27 and the substrate 18 with respect to the outside air, enhancing the effect of preventing the inflow of foreign substances through the lateral side.

The volatilization of the imprint material 15 is also prevented with the substrate 18 and the top plate 27 closed to each other. The narrow gap between the substrate 18 and the top plate 27 makes gas hard to flow in and out, maintaining the saturated water vapor content of the imprint material 15 in this space to prevent the volatilization of the imprint material 15. Resins have different properties from one another, which means that the gap between the upper surface of the substrate 18 and the bottom surface of the top plate 27 is optimized. A configuration with the intake of the ambient gas as illustrated in FIG. 4D is expected to produce the ambient gas containing the saturated water vapor of the imprint material 15 to prevent the volatilization of the imprint material 15.

(Material of Top Plate)

The following is a description of materials used for the top plate 27 according to the present exemplary embodiment. In the imprint apparatus 1, most of the substrate processing on the substrate 18 by each unit is performed in a non-contact way. That means that the substrate processing can be performed on the substrate under the top plate 27 on the substrate holding apparatus, the top plate of which is made of a material (e.g., quartz) that transmits light used by the foreign substance inspection unit 100a and light used in exposure by the exposure unit 102a. This protects the upper surface of the substrate 18 in the substrate processing.

More specifically, the substrate processing is performable with the top plate 27 disposed on the foreign substance inspection unit 100a, the temperature adjustment unit 100b, the position detection unit 100c, the exposure unit 102a, and the overlay inspection unit 102b, other than the transfer unit 101. In addition, the substrate processing performed on the upper surface of the substrate 18 in a non-contact way, including various measurements using light, can be performed with the top plate 27 present. However, the transfer unit 101 cannot perform the substrate processing with the top plate 27 present, as the mold 17 is brought into contact with the upper surface of the substrate 18 in the imprint processing.

Figure 5A:
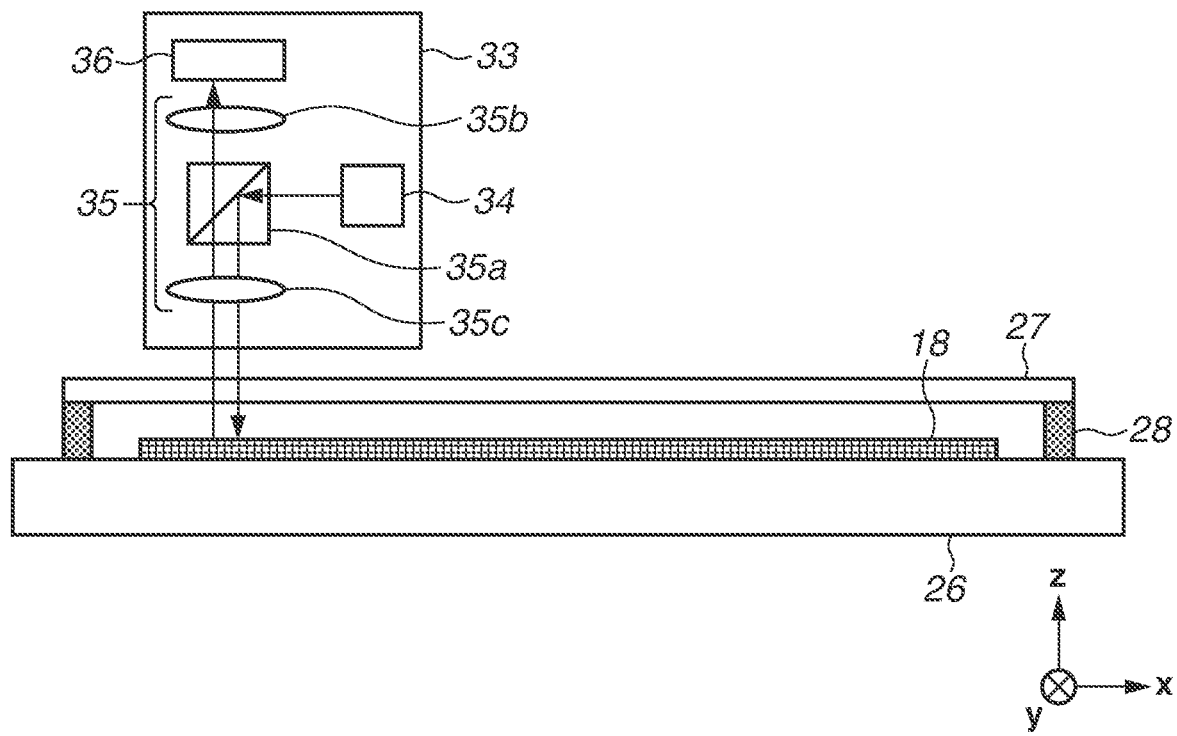
FIGS. 5A and 5B illustrate the substrate processing performed with a light-transmitting top plate.

An example will be described of performing substrate processing on the substrate 18 in a non-contact way with the top plate 27 mounted on the substrate holding apparatus with reference to FIGS. 5A and 5B. FIG. 5A illustrates an example of optical measurement of the substrate 18 by the measurement unit 33. The example in FIG. 5A illustrates the substrate processing of observation of the upper surface of the substrate 18 by the position detection unit 100c and the overlay inspection unit 102b, and of inspection of the upper surface of the substrate 18 for foreign substances through images.

The measurement unit 33 includes a light source 34, optical members 35, and a sensor 36. The optical members 35 include a semi-reflective mirror 35a and lenses 35b and 35c. Illumination light emitted by the light source 34 passes through the optical members 35 and the top plate 27, and enters a desired position on the substrate 18. Then, light reflected by the substrate 18 passes through the top plate 27 and the optical members 35, and enters the sensor 36.

The light source 34 may be a LED, which has been miniaturized in recent years. The light source 34 may be light guided through an optical fiber from a separate light source such as a mercury lamp. The type of the sensor 36 is selected depending on the application. An image sensor or a line sensor as the sensor 36 detects signals from the substrate 18 and calculates positions based on the features of the signal waveforms.

Figure 5B:
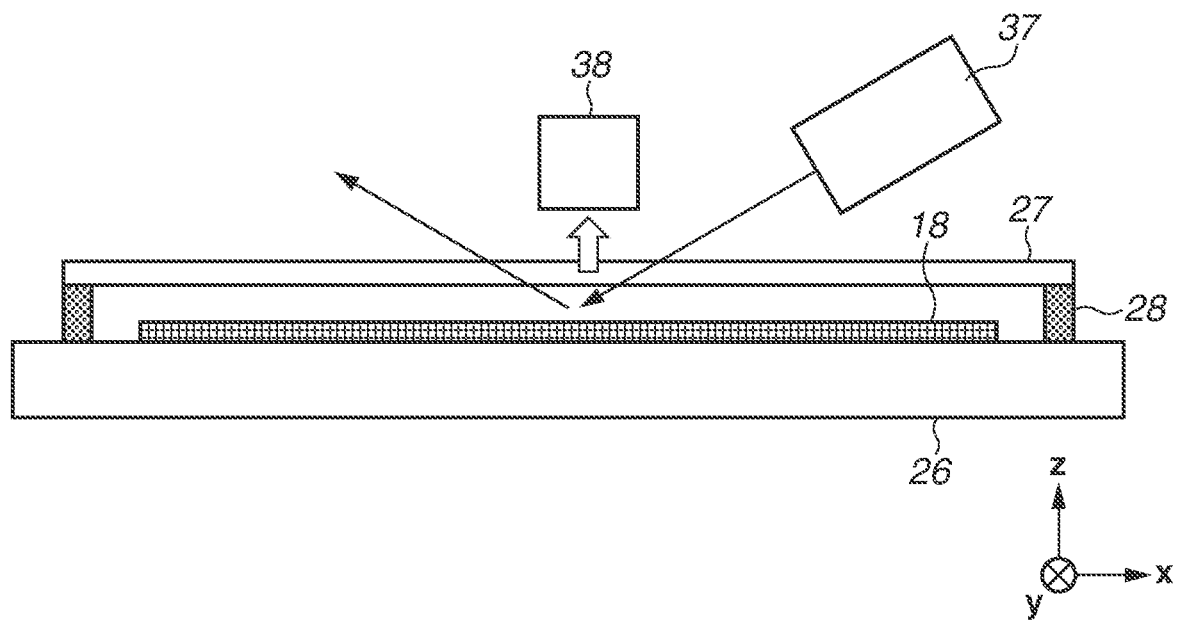

FIG. 5B illustrates an example of foreign substance inspection by the foreign substance inspection unit 100a. Light emitted by a light source 37 obliquely enters a desired position on the substrate 18. Light scatters from a foreign substance, if any, at the position, which is received and detected as a foreign substance by the sensor 38.

Thus, the use of a light-transmitting material for the top plate 27 allows each unit to perform the substrate processing with the top plate 27 mounted on the substrate holding apparatus, preventing foreign substances from falling on the substrate 18 and the volatilization of the imprint material 15 in the substrate processing.

In one or more embodiments, electrostatic force is applied to the top plate 27 and/or the member 28, attracting foreign substances to prevent them from falling on the substrate 18.

(Method of Conveying Substrate)

Figure 6A:
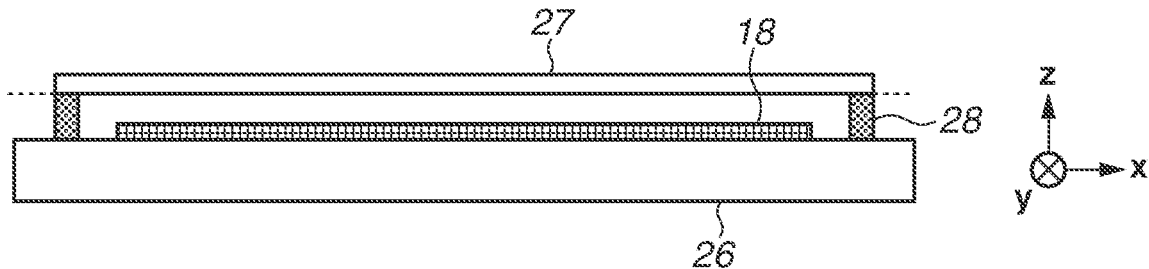
FIGS. 6A to 6D illustrate a substrate transfer operation according to a first exemplary embodiment.

The substrate 18 is conveyed from a unit to the substrate holding apparatus with the substrate 18 held by the conveyance unit 24. A method will be described of conveying the substrate 18 from the substrate holding apparatus to the substrate conveyance apparatus 42 with reference to FIGS. 6A to 6D. FIGS. 6A to 6D illustrate the operation of conveying the substrate 18 by the substrate holding apparatus. FIG. 6A illustrates the substrate 18 placed on the substrate holding unit 26 of the substrate holding apparatus.

Figure 6B:
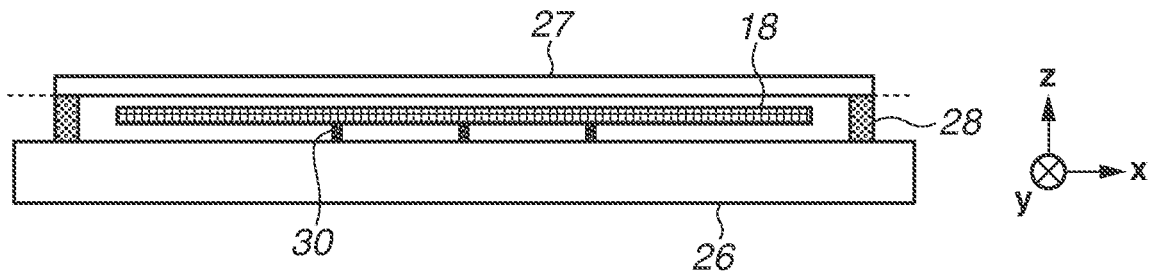

FIG. 6B illustrates the substrate 18 lifted by protrusions 30, which protrude from the substrate holding unit 26, to a level where the substrate 18 is not in contact with the top plate 27. The substrate conveyance apparatus 42 is inserted into the space made by the substrate 18 being lifted, and the substrate conveyance apparatus 42 receives the substrate 18.

Figure 6C:
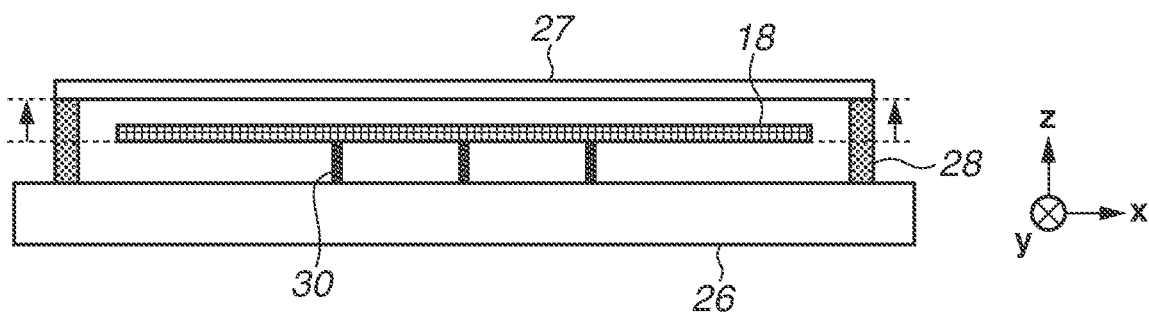

A narrower space between the substrate holding unit 26 and the top plate 27 due to an insufficient lift of the substrate 18 may not accommodate the substrate conveyance apparatus 42. In such a case, as illustrated in FIG. 6C, the space under the substrate 18 to accommodate the substrate conveyance apparatus 42 is made by the member 28 being extended. To prevent foreign substance from falling on the upper surface of the substrate 18, the gap between the top plate 27 and the substrate 18 remains unchanged. Specifically, it is suitable that the top plate 27 and the substrate 18 are lifted simultaneously; however, they may be lifted separately.

Figure 6D:
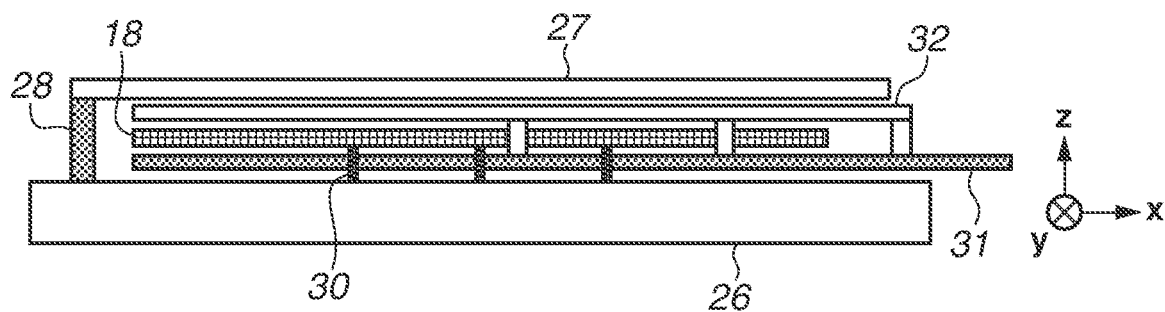

In some embodiments, the substrate conveyance apparatus 42, which receives the substrate 18, has a top plate (hereinafter referred to as a cover 32) on it. In such a case, the substrate conveyance apparatus 42 is inserted so that the substrate 18 is between the substrate holding unit 31 and the cover 32 of the substrate conveyance apparatus 42 to receive the substrate 18. More specifically, as illustrated in FIG. 6D, the substrate 18 is received with the top plate 27, the cover 32 of the substrate conveyance apparatus 42, the substrate 18, the substrate holding unit 31 of the substrate conveyance apparatus 42, and the substrate holding unit 26 alternately arranged from the top downward. Such a way of receiving the substrate 18 enables the substrate 18 to be protected by the cover 32 of the substrate conveyance apparatus 42 even after the substrate 18 has been received to the substrate conveyance apparatus 42.

The present configuration is as an example. The inverted positions of the top plate 27 and cover 32 when the substrate 18 is received has a similar effect.

In addition, the reverse order of the above-mentioned procedure when the substrate holding apparatus receives the substrate 18 from the substrate conveyance apparatus 42 allows the receipt of the substrate 18 while the substrate 18 is protected.

As described above, the substrate holding apparatus with the top plate 27 in close proximity to the substrate 18 prevents foreign substances from falling on the substrate 18. The configuration is also expected to have an effect of preventing the volatilization of the imprint material 15 on the substrate 18. In addition, the cover 32 of the substrate holding unit added to the substrate conveyance apparatus 42 in addition to the above configuration enables the protection of the substrate 18 even during the conveyance of the substrate 18 in the imprint apparatus 1.

In the present exemplary embodiment, the mold for transferring a circuit pattern, which is a structural pattern formed in the mold 17, has been described. However, a mold having a flat portion, which means that the mold 17 has no structural pattern portion (blank template), is also applicable. The blank template is used for a flattening apparatus that flattens a composition on a substrate by using a flat portion. In other words, the present exemplary embodiment is applied to molding apparatuses (e.g., an imprint apparatus and a flattening apparatus) that mold a composition on a substrate by using a mold.

A second exemplary embodiment will be described. In the first exemplary embodiment, the method has been described of receiving a substrate by the substrate conveyance apparatus with its top plate from the substrate holding apparatus with its top plate. In the present exemplary embodiment, a method will be described of receiving a substrate and a top plate by the substrate conveyance apparatus 42 without its top plate (cover) from a substrate holding apparatus at the same time. The configuration of the imprint apparatus 1 and the material of the top plate 27 are similar to those according to first exemplary embodiment, and redundant descriptions thereof will be omitted. The content not described in the present exemplary embodiment is the same as that in the first exemplary embodiment.

The substrate 18 is placed on the substrate chuck 12 with its top plate 27 mounted thereon, and these are conveyed as one set. In this case, if vacuum attraction is used in substrate chucking, the attraction may be continued with a small power source and a suction device mounted on the chuck, or the attraction force may be maintained with the suction valve closed. For electrostatic attraction, the attraction may be continued with a small power source and an electrostatic generator, or the attraction of the substrate may be continued by the electrostatic input and output being cut off after the attraction. In other attraction methods, the substrate can be conveyed with the substrate continuously attracted to the substrate chuck.

When conveying the substrate 18 to the substrate holding apparatus as another unit, the substrate conveyance apparatus 42 holds the substrate 18. A substrate transfer method will be described of transferring the substrate 18 from the substrate holding apparatus to the substrate conveyance apparatus 42 will be described with reference to FIGS. 7A to 7D. FIGS. 7A to 7D illustrate the operation of transferring the substrate 18 by the substrate holding apparatus according to the present exemplary embodiment. The top plate 27 of the substrate holding apparatus according to the present exemplary embodiment has hollow portions 39 and 40 in it as illustrated in FIG. 7A. The top plate 27 is held with the member 28 inserted into the hollow portion 39.

FIG. 7A illustrates the substrate 18 placed on the substrate holding unit 26 of the substrate holding apparatus. FIG. 7B illustrates the substrate 18 lifted by protrusions 30 protruding from the substrate holding unit 26 to an level where the substrate 18 is not in contact with the top plate 27. As illustrated in FIG. 7C, the substrate conveyance apparatus 42 is inserted into the space created under the substrate 18 lifted, and then the substrate conveyance apparatus 42 receives the substrate 18. The member 28 may be extended as in the first exemplary embodiment.

Then, the substrate conveyance apparatus 42 is lifted toward the top plate 27, receives the substrate 18 and the top plate 27 at the same time, and then conveys them to another unit. To receive them, as illustrated in FIG. 7D, the member 41 on the substrate conveyance apparatus 42 is inserted into the hollow portion 40 in the top plate 27, holding the top plate 27 to the substrate conveyance apparatus 42. As illustrated in FIG. 7D, the member 28 inserted into the hollow portion 39 in the top plate 27 is removed out of the hollow portion 39.

Such a way of receiving the substrate 18 allows the substrate 18 to be protected by the top plate 27 even after the substrate 18 has been transferred to the substrate conveyance apparatus 42. The reverse order of the above procedure enables the substrate 18 and the top plate 27 with the top plate 27 continuously protecting the substrate 18 to be transferred when the substrate holding apparatus receives the substrate 18 from the substrate conveyance apparatus 42.

It is suitable that the top plate 27 has the same size as the substrate 18, allowing the top plate 27 to be carried out from the inside of the imprint apparatus 1 to the outside thereof along the path for carrying in and out the substrate 18. In addition, the regular replacement and/or cleaning of the top plate 27 maintains the environment in the imprint apparatus 1 clean.

As above mentioned, the substrate holding apparatus with the top plate 27 in close proximity to the substrate 18 prevents foreign substances from falling on the substrate 18. The configuration is also expected to have an effect of preventing the volatilization of the imprint material 15 on the substrate 18. The transfer of the substrate 18 and the top plate 27 at a time enables protecting the substrate 18 even during the conveyance of the substrate 18 in the imprint apparatus 1. In addition, the same top plate 27 before and after the transfer of the substrate 18 results in a small space for transferring the substrate 18 as compared with the case of using different top plates, reducing the amount of gas flowing into between the top plate 27 and the substrate 18. That is expected to have higher effects of preventing foreign substances from falling on the substrate 18 and the volatilization of the imprint material 15 than those in the first exemplary embodiment.

In the present exemplary embodiment, the mold has been described of transferring a circuit pattern, i.e., a structural pattern on the mold 17. However, a mold having a flat portion, which means that the mold 17 has no pattern profile portion (blank template), is also applicable. The blank template is used for a flattening apparatus that flattens a composition on a substrate by using a flat portion. In other words, the present exemplary embodiment is applied to molding apparatuses (e.g., an imprint apparatus and a flattening apparatus) that mold a composition on a substrate by using a mold.

Although, in the present exemplary embodiment, the operations performed inside the transfer apparatus have been described, the present invention is not limited thereto. In the present invention, a top plate provided when a substrate is held has an effect of preventing foreign substances from falling on a substrate and the volatilization of a material coated on the substrate. As a result, the present invention is also applicable to apparatuses and units used in a process of inspecting defects and overlay on a substrate and a process of applying a material thereto.

Exemplary Embodiment of Product Manufacturing Method

A method will be described of manufacturing articles (electric circuit element, optical element, Micro Electro Mechanical Systems (MEMS), recording device, sensor, or mold) by using an imprint apparatus described above. Cured material patterns formed by using the imprint apparatus are permanently used for at least some among various types of articles, or temporarily used in manufacture of various types of articles. Examples of electric circuit elements include volatile and nonvolatile semiconductor memories such as a dynamic random access memory (DRAM), a static random access memory (SRAM), a flash memory, and a magnetoresistive random access memory (MRAM), and include semiconductor devices such as a large scale integrated circuit (LSI), a charge coupled device (CCD), an image sensor, and a field programmable gate array (FPGA). Examples of molds include a mold for imprint processing.

Cured material patterns are used as they are as at least some component members included in the above-described articles, or temporarily used as resist masks. After the completion of etching or ion implantation in a working process of a substrate, the resist mask is removed. Further, post-processing processes for the substrate include oxidation, film formation, evaporation, doping, flattening, etching, resist separation, dicing, bonding, and packaging.

Figure 8A:
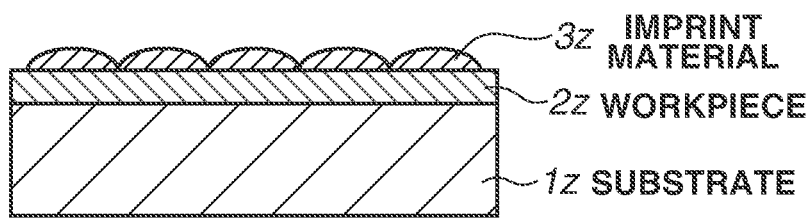
FIGS. 8A to 8F illustrate an article manufacturing method.

A specific article manufacturing method will be described with reference to FIGS. 8A to 8F. As illustrated in FIG. 8A, a substrate 1z such as a silicon wafer is prepared with a workpiece 2z such as an insulator formed over the surface of the substrate 1z. Then, an imprint material 3z is applied to the surface of the workpiece 2z through an ink-jet method. FIG. 8A illustrates a plurality of droplets of the imprint material 3z applied onto the substrate 1z.

Figure 8B:
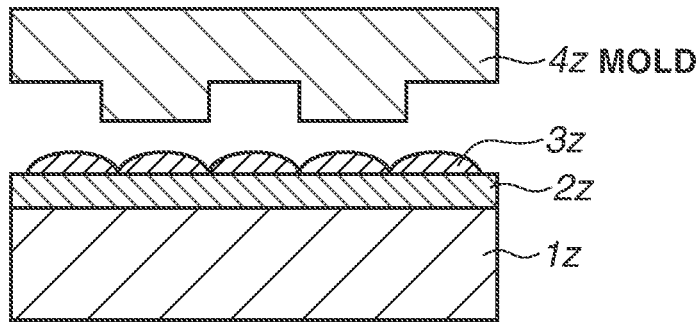
Figure 8C:
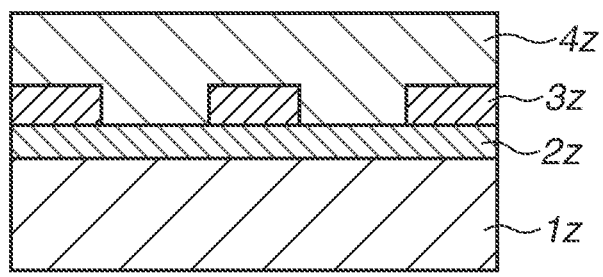

As illustrated in FIG. 8B, the surface with a structural pattern thereon of a mold 4z for imprint is disposed facing the imprint material 3z over the substrate 1z. As illustrated in FIG. 8C, the substrate 1z with the imprint material 3z thereon and the mold 4z are brought into pressure contact with each other. The gap between the mold 4z and the workpiece 2z is filled with the imprint material 3z. In this state, when the imprint material 3z is irradiated with light as a curing energy through the mold 4z, the imprint material 3z is cured.

Figure 8D:
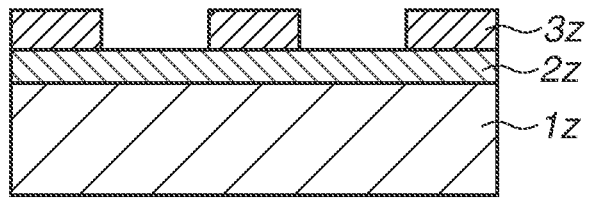

As illustrated in FIG. 8D, after the imprint material 3z has been cured, the mold 4z and the substrate 1z are separated from each other, forming the pattern of the cured imprint material 3z over the substrate 1z. The pattern of this cured material is shaped so that the hollow portions of the mold 4z fit into the protrusive portions of the cured material 3z, respectively, and vice versa. This means that the structural pattern of the mold 4z has been transferred onto the imprint material 3z.

Figure 8E:
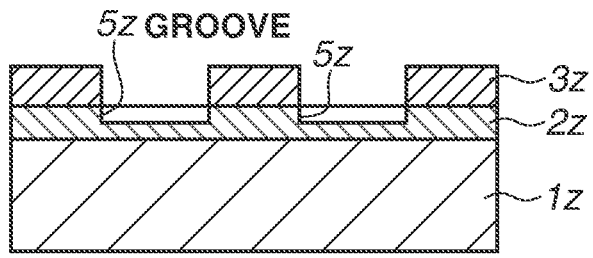
Figure 8F:
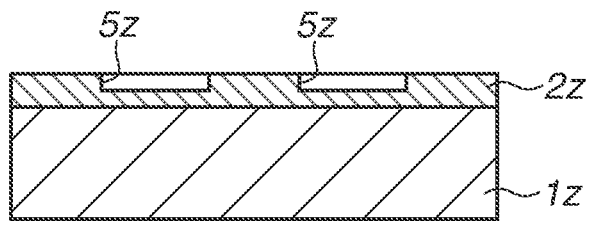

As illustrated in FIG. 8E, etching the surface with the pattern of the cured material 3z as an etching-proof mask removes the thinly remaining or non-cured material 3z to form grooves 5z. As illustrated in FIG. 8F, after the pattern of the cured material 3z is removed, an article with the grooves 5z formed in the surface of the workpiece 2z is obtained. The pattern of the cured material 3z is removed in this example, but, in one or more embodiments, the cured material 3z is removed after the processing. For example, the cured material 3z is used as a film for insulation between layers included in a semiconductor device, in other words as a component member of the article. The article manufacturing method according to the present exemplary embodiment is beneficial to at least one of performance, quality, productivity, or production cost of an article as compared with the cases of conventional methods.

While the present invention has specifically been described based on the above-described exemplary embodiments, the present invention is not limited thereto but modifications and variations in diverse ways can be used within the scope of the appended claims.

The present invention makes it possible to provide, for example, a substrate processing method of reducing foreign substances on a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-143389, filed Aug. 27, 2020, which is hereby incorporated by reference herein in its entirety.

What is claimed is:

1. A substrate processing method comprising:
   a first process configured to process a substrate with a top plate disposed proximal to an upper surface of the substrate, the substrate being held by a substrate holding unit of a first substrate holding apparatus;

a second process to raise the substrate with the top plate disposed on the first substrate holding apparatus to make a space between the substrate holding unit and the substrate;

a third process to insert a substrate conveyance apparatus for conveying the substrate with the top plate disposed on the first substrate holding apparatus to a second substrate holding apparatus into the space; and a fourth process to convey the substrate to the second substrate holding apparatus, wherein the substrate processing in the first process is processing for irradiating the substrate with light, and wherein the top plate transmits the light.

2. The substrate processing method according to claim 1, wherein a space between the substrate holding unit and the top plate in the second process is larger than a space between the substrate holding unit and the top plate in the first process.

3. The substrate processing method according to claim 1, wherein a space between the upper surface of the substrate and a bottom surface of the top plate in the first process is narrower than or equal to 2 mm.

4. The substrate processing method according to claim 1, wherein the second process protrudes a protrusion from the substrate holding unit to raise the substrate.

5. The substrate processing method according to claim 1, wherein the first substrate holding apparatus includes a member for holding the top plate, and wherein the member is disposed on the substrate holding unit to provide a space where the substrate is taken out in the lateral direction.

6. The substrate processing method according to claim 1, wherein a cover is disposed nearer the upper surface side of the substrate in the fourth process, and wherein a space between the upper surface of the substrate and a bottom surface of the cover in the fourth process is narrower than or equal to 2 mm.

7. The substrate processing method according to claim 6, further comprising a process of transferring the substrate and the top plate from the substrate holding apparatus to the substrate conveyance apparatus between the third and the fourth processes, wherein the cover is the top plate.

8. The substrate processing method according to claim 6, wherein the cover is a cover provided on the substrate conveyance apparatus.

9. The substrate processing method according to claim 6, wherein, in the fourth process, the space between the cover and the substrate is set to a positive pressure with respect to outside air.

10. The substrate processing method according to claim 1, wherein, in at least one of the first, the second, or the third processes, the space between the top plate and the substrate is set to a positive pressure with respect to outside air.

11. The substrate processing method according to claim 1, wherein the method is a substrate processing method for a molding apparatus for bringing a mold into contact with a composition applied to the substrate to mold the composition, and wherein the substrate processing in the first process is included in one of a foreign substance inspection on the substrate, a temperature adjustment on the substrate, a position detection on the substrate, an exposure to the substrate, and an overlay inspection on the substrate.

12. The substrate processing method according to claim 1, wherein the method is a substrate processing method for an exposure apparatus for exposing a photosensitive agent applied on the substrate to light to form a pattern, and wherein the processing is included in one of a foreign substance inspection on the substrate, a temperature adjustment on the substrate, a position detection on the substrate, a pattern transfer to the substrate, and an overlay inspection on the substrate.

13. A substrate holding apparatus used in substrate processing, the substrate holding apparatus comprising:

a substrate holding unit configured to hold a substrate; and a top plate disposed proximal to the upper surface of the substrate, wherein a space between the upper surface of the substrate and a bottom surface of the top plate is narrower than or equal to 2 mm.

14. A substrate conveyance apparatus to convey a substrate, the substrate conveyance apparatus comprising:

a substrate holding unit configured to hold the substrate; and a cover disposed proximal to the upper surface of the substrate, wherein a space between the upper surface of the substrate and a bottom surface of the cover is narrower than or equal to 2 mm.

15. A molding apparatus to process a substrate by a substrate processing method comprising:

a first process to process the substrate with a top plate disposed nearer an upper surface of the substrate, the substrate being held by a substrate holding unit of a first substrate holding apparatus;

a second process to raise the substrate with the top plate disposed on the first substrate holding apparatus to make a space between the substrate holding unit and the substrate;

a third process to insert a substrate conveyance apparatus for conveying the substrate with the top plate disposed on the first substrate holding apparatus to a second substrate holding apparatus into the space; and a fourth process to convey the substrate to the second substrate holding apparatus, wherein the molding apparatus includes a mold for molding a composition applied on the substrate, wherein the molding apparatus brings the mold into contact with the composition to mold the composition, wherein the substrate processing in the first process is processing for irradiating the substrate with light, and wherein the top plate transmits the light.

16. An article manufacturing method of manufacturing an article based on a substrate processed through a working process, the article manufacturing method comprising:

a molding process to mold a composition applied to a substrate using a molding apparatus to mold the composition; and a working process to process the substrate with the composition molded through the molding process thereon, wherein the molding apparatus processes a substrate by a substrate processing method comprising:

a first process to process the substrate with a top plate disposed nearer an upper surface of the substrate, the substrate being held by a substrate holding unit of a first substrate holding apparatus;

a second process to raise the substrate with the top plate disposed on the first substrate holding apparatus to make a space between the substrate holding unit and the substrate;

a third process to insert a substrate conveyance apparatus for conveying the substrate with the top plate disposed on the first substrate holding apparatus to a second substrate holding apparatus into the space; and a fourth process to convey the substrate to the second substrate holding apparatus, wherein the molding apparatus includes a mold for molding a composition applied on the substrate, wherein the molding apparatus brings the mold into contact with the composition to mold the composition, wherein the substrate processing in the first process is processing for irradiating the substrate with light, and wherein the top plate transmits the light.

* * * * *